(12) United States Patent
Soe et al.

(10) Patent No.: US 8,836,407 B1
(45) Date of Patent: Sep. 16, 2014

(54) GILBERT MIXER WITH NEGATIVE $G_m$ TO INCREASE NMOS MIXER CONVERSION

(71) Applicant: Tensorcom, Inc., Carlsbad, CA (US)

(72) Inventors: Zaw Soe, Encinitas, CA (US); Tham KhongMeng, San Diego, CA (US)

(73) Assignee: Tensorcom, Inc., Carlsbad, CA (US)

( * ) Notice: Subject to any disclaimer, the term of this patent is extended or adjusted under 35 U.S.C. 154(b) by 0 days.

(21) Appl. No.: 13/789,681

(22) Filed: Mar. 8, 2013

(51) Int. Cl.
*G06F 7/44* (2006.01)
*G06G 7/16* (2006.01)

(52) U.S. Cl.
CPC .................................. *G06G 7/16* (2013.01)
USPC .......................................... 327/357; 455/232.1

(58) Field of Classification Search
CPC ....... G06G 7/163; G06G 7/16; H03D 7/1428; G05G 7/164; G06N 3/0635
USPC ................ 455/232.1, 323, 455, 333; 327/357
See application file for complete search history.

(56) References Cited

U.S. PATENT DOCUMENTS 7,403,758 B2 * 7/2008 Rector ...................... 455/232.1

OTHER PUBLICATIONS

47 CFR § 15.257 Operation within the band 57-64 GHz.
"ECE145B/ECE218B Mixer Lectures" by Prof. S. Long , UCSB class notes, http://www.ece.ucsb.edu/Faculty/rodwell/Classes/ece218b/notes/Mixer1.pdf.

* cited by examiner

*Primary Examiner* — Lincoln Donovan
*Assistant Examiner* — Diana J Cheng
(74) *Attorney, Agent, or Firm* — Thaddeus Gabara; Tyrean Patent Prosecution Law Firm

(57) ABSTRACT

A cross coupled NMOS transistors providing a negative $g_m$ transistor feedback allows a mixer to saturate at a reduced input signal swing voltage when compared to a conventional mixer allowing the mixer to enter into the current mode operation at a reduced signal input voltage range. The linearity of the baseband signal path can be traded against the mixer gain and is improved if the signal swing in the baseband signal path is reduced. The input mixer transistors operate in the saturated mode at a reduced input signal swing voltage causing the power efficiency of the system to increase since the transmit chain operates at a class-D power efficient. Efficiency is very important in mobile applications to save and extend the battery power of a mobile phone providing a better utilization of the available power since most of that power is supplied to the energy of the outgoing modulated signal.

20 Claims, 6 Drawing Sheets

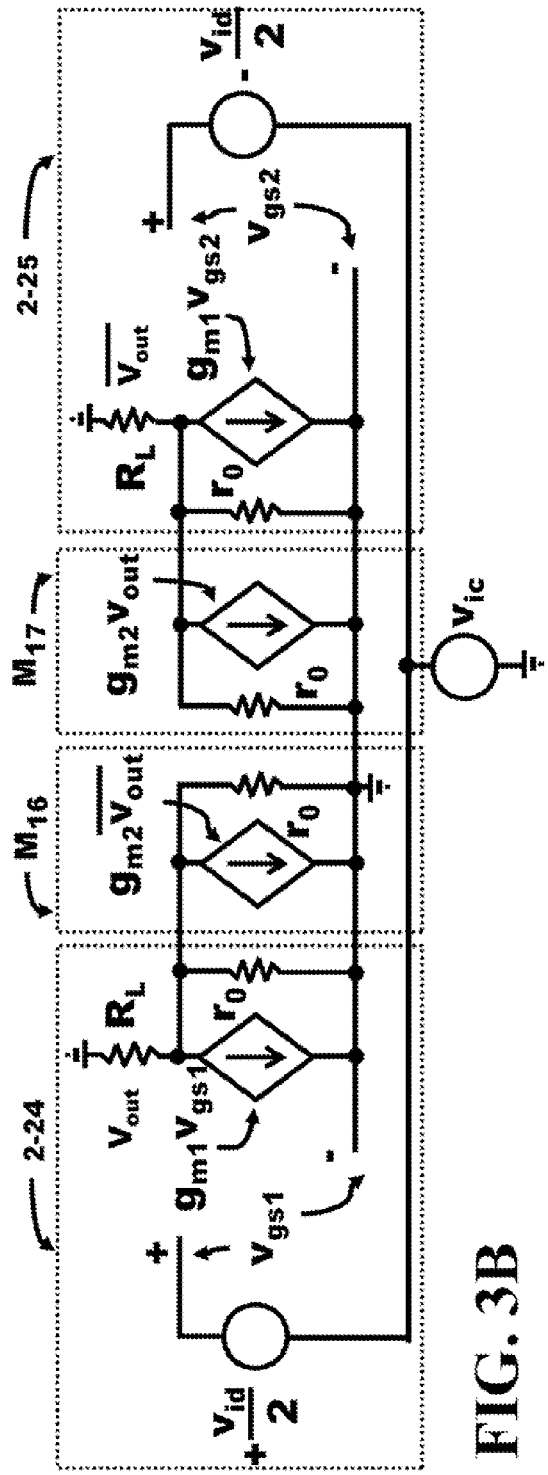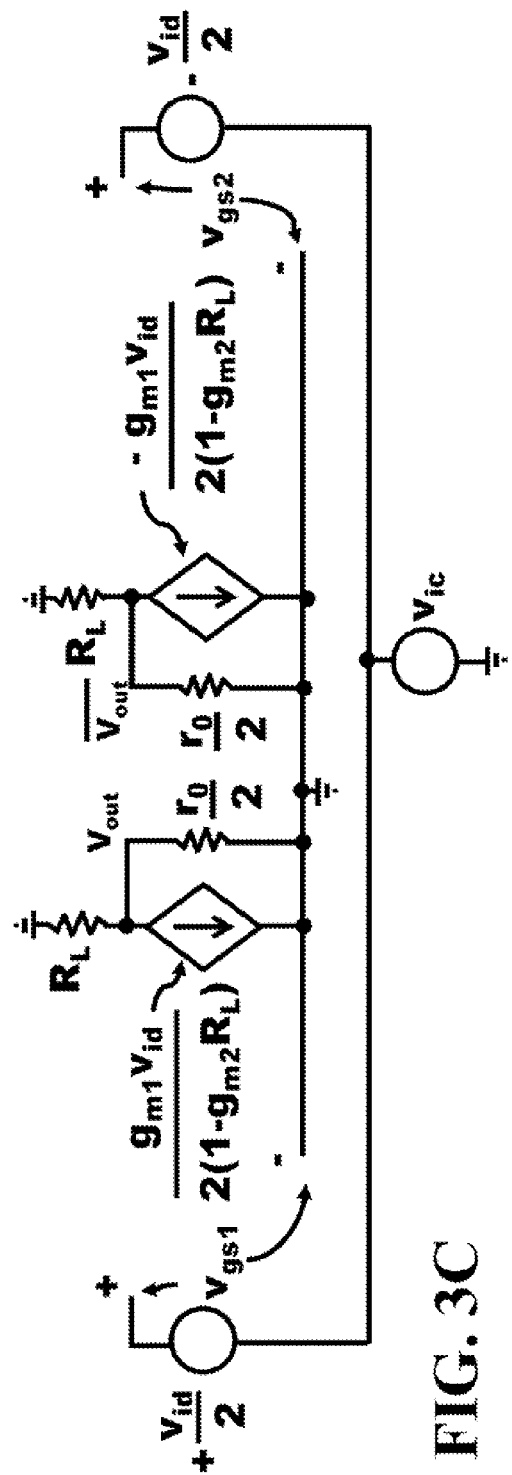
FIG. 3B
FIG. 3C

GILBERT MIXER WITH NEGATIVE $G_m$ TO INCREASE NMOS MIXER CONVERSION

BACKGROUND OF THE INVENTION

The present application is related to the co-filed U.S. application Ser. No. 13/789,682 entitled "Frequency Pulling Reduction in Wide-Band Direct Conversion Transmitters" filed on Mar. 8, 2013, which is assigned to the same assignee as the present application and incorporated herein by reference in its entirety.

The Federal Communications Commission (FCC) has allotted a spectrum of bandwidth in the 60 GHz frequency range (57 to 64 GHz). The Wireless Gigabit Alliance (WiGig) targets the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or GaAs (Gallium Arsenide) technology to form the dice in these designs.

CMOS (Complementary Metal Oxide Semiconductor) is the primary technology used to construct integrated circuits. N-channel transistors and P-channel transistors (MOS transistor) are used in this technology which uses fine line technology to consistently reduce the channel length of the MOS transistors. Current channel length examples are 40 nm, the power supply of VDD equals 1.2V and the number of layers of metal levels can be 8 or more. This technology scales and can achieve operation in the 60 GHz range.

Transceivers for the 60 GHz system have been formed in CMOS and comprise at least one transmitter and at least one receiver which are used to interface to other transceivers in a communication system. The transceivers receive or transmit electrical signals into the LNA or the power amplifier, respectively. These electrical signals are generated by or provided to an antenna. The antenna is a transducer that converts incoming electromagnetic energy from free space into electrical signals on the receive side of the transceiver or converts electrical signals into electromagnetic energy for transfer into free space.

The transmitter needs to provide a signal to the antenna consisting of a 60 GHz carrier frequency range. The Gilbert mixer plays a fundamental role in up-converting a baseband signal to this carrier frequency range. Binary Phase Shift Keying (BPSK) is the modulation scheme used to carry the baseband at the 60 GHz carrier frequency range. The Gilbert mixer also plays a fundamental role in down-converting a Radio Frequency (RF) signal to baseband.

The Gilbert mixer mixes a local oscillator signal at a given frequency with a baseband signal. The oscillator signal typically has a full rail to rail voltage swing and can be viewed as a "square wave" applied to the gates of the transistors in the Gilbert mixer. These gates then act like switches that become enabled and disabled in sequential order. The reduced swing from the baseband, however, has only a limited swing of 300 mV and must be of sufficient magnitude to place the drive the gates of the driven transistors into saturation.

One type of transistor used in the Gilbert mixer is an N-Metal Oxide Semiconductor (NMOS) transistors, although these gates can also be P-Metal Oxide Semiconductor (PMOS) transistors. Both of these types of transistors are used in the Complementary Metal Oxide Semiconductor (CMOS) technology. In addition, any technology of transistors can be used for the Gilbert mixer; bipolar, hetro-junction, etc.

BRIEF SUMMARY OF THE INVENTION

In accordance with one aspect of the invention, the inventive cross-coupled negative $g_m$ feedback technique allows the Gilbert mixer to saturate at a reduced input signal swing voltage (150 mV) when compared to a conventional Gilbert mixer (300 mV). The inventive cross coupled NMOS transistors providing a negative $g_m$ transistor feedback technique allows the innovative Gilbert mixer to enter into the current mode operation at a reduced signal input voltage range. The linearity of the baseband signal path can be traded against the Gilbert mixer gain. The linearity of the baseband signal path improves if the signal swing in the baseband signal path is reduced. In addition, since the input mixer transistors operate in the saturated mode at a reduced input signal swing voltage, the power efficiency of the system to increases.

Another illustrative embodiment of the inventive cross coupled NMOS transistors providing a negative $g_m$ transistor feedback technique is to drive the transmit chain with a higher gain. Typically, the efficiency of the transmit chain is very important in mobile applications to save battery power and extend the time or usage of the mobile phone. The transmit chain operates in the non-linear mode allowing the transmit chain to reach the highest class-D power efficient. A higher efficiency transmit chain provides a better utilization of the available power since most of that power is supplied to the energy of the outgoing electromagnetic waveform that is carrying the modulated signal.

In another illustrative embodiment of the inventive technique, the linearity in the transmit chain is not important for the two constellation BPSK modulation since the modulated signal is easy to recover because of the 180° separation between a 1 (on mode) and a 0 (off mode). Thus, the transmit chain operates in the non-linear mode and there is no need to back down on the input power applied to the front end of the transmit chain. The inventive cross coupled NMOS transistors providing a negative $g_m$ transistor feedback technique mixer that generates a 60 GHz signal where the $2^{nd}$ and $3^{rd}$ harmonics are 120 GHz and 180 GHz, respectively. The transmit chain comprising of tank circuits and the antenna are naturally occurring bandpass filters and have a bandwidth limited region based around 60 GHz.

Another illustrative embodiment of the inventive technique comprises the inventive cross coupled NMOS transistors providing a negative $g_m$ transistor feedback technique mixer where the differential cross coupled transistor circuit provides the feedback and increases the overall $g_m$ of the Gilbert mixer. This very special feature of the inventive technique prevents the saturation of the input chain of the baseband while still allowing better linearity and power efficiency.

A Gilbert mixer apparatus comprising a first differential switch that couples a first differential voltage to current converter to a differential current to voltage converter and the first differential voltage to current converter further comprising a cross coupled same conductivity MOS transistor circuit. The apparatus further comprising a differential capacitance adjustment circuit coupled to the first differential current to voltage converter where a differential capacitance can be adjusted by a variable voltage. The apparatus further comprising a second differential voltage to current converter. The apparatus further comprising a second differential switch that couples the second differential voltage to current converter to the differential current to voltage converter. The apparatus wherein the cross coupled same conductivity MOS transistor circuit increases the gain of the first differential voltage to current converter, wherein the first differential current to voltage converter is a differential load and wherein the first differential load can be formed from a resistive, an inductive or a capacitive loads or any combination therein. The apparatus further comprising a differential i-signal coupled to the first differential voltage to current converter, a differential q-signal coupled to the second differential voltage to current converter, a differential in-phase oscillation signal coupled to the first differential switch, a differential quadrature phase oscillation signal coupled to the second differential switch and the first and second differential switch are coupled to a differential current to voltage converter, whereby the differential i-signal and the differential q-signal are converted to the frequency of the oscillation signal.

A Gilbert mixer apparatus comprising a first differential voltage to current converter, a first differential current to voltage converter, a first differential switch that couples the first differential voltage to current converter to the first differential current to voltage converter and the first differential voltage to current converter further comprises a cross coupled same conductivity MOS transistor circuit. The apparatus further comprising a differential capacitance adjustment circuit coupled to the first differential current to voltage converter where a differential capacitance can be adjusted by a variable voltage, further comprising a second differential voltage to current converter and further comprising a second differential switch that couples the second differential voltage to current converter to the differential current to voltage converter. The apparatus wherein the cross coupled same conductivity MOS transistor circuit increases the gain of the first differential voltage to current converter, wherein the first differential current to voltage converter is a differential load and wherein the first differential load can be formed from a resistive, an inductive or a capacitive loads or any combination therein.

A method of up-converting a differential in-phase and differential quadrature signal to a frequency of an oscillator signal comprising the steps of providing the differential in-phase baseband signal to a first differential voltage to current converter with a first cross coupled same conductivity MOS transistor circuit, providing the differential quadrature baseband signal to a second differential voltage to current converter with a second cross coupled same conductivity MOS transistor circuit, coupling the first differential voltage to current converter to a differential current to voltage converter using a first differential switch, coupling the second differential voltage to current converter to the differential current to voltage converter using a second differential switch, providing a differential in-phase oscillator signal to the first differential switch and providing a differential quadrature oscillator signal to the second differential switch, thereby up-converting the differential in-phase and differential quadrature signal to the frequency of the oscillator signal. The method further comprising the steps of adjusting the frequency of the up-converted differential signal with a differential capacitance adjustment circuit. The method further comprising the steps of applying an adjustment voltage to the differential capacitance adjustment circuit to vary the capacitance. The method whereby the first cross coupled same conductivity MOS transistor circuit reduces the saturation voltage of the first differential voltage to current converter and the second cross coupled same conductivity MOS transistor circuit reduces the saturation voltage of the second differential voltage to current converter. The method further comprising the steps of coupling the up-convened differential signal to a power amplifier stage, wherein the power amplifier stage provides a higher efficiency and improved power usage.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be thorough and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 3B shows a small signal model of one of the Gilbert mixers in FIG. 3A in accordance with the present invention.

FIG. 3C illustrates a simplified version of the model presented in FIG. 3B in accordance with the present invention.

DETAILED DESCRIPTION OF THE INVENTION

This invention has been incorporated into the transceiver design for a 60 GHz wireless system. The inventive apparatus is applicable to any high frequency system, for example, where the Gilbert mixer up-converters a baseband signal to an RF signal. The Gilbert mixer can also be used in the down-conversion of an RF signal to convert the signal from a Low Noise Amplifier (LNA) to baseband for further processing.

Figure 1:
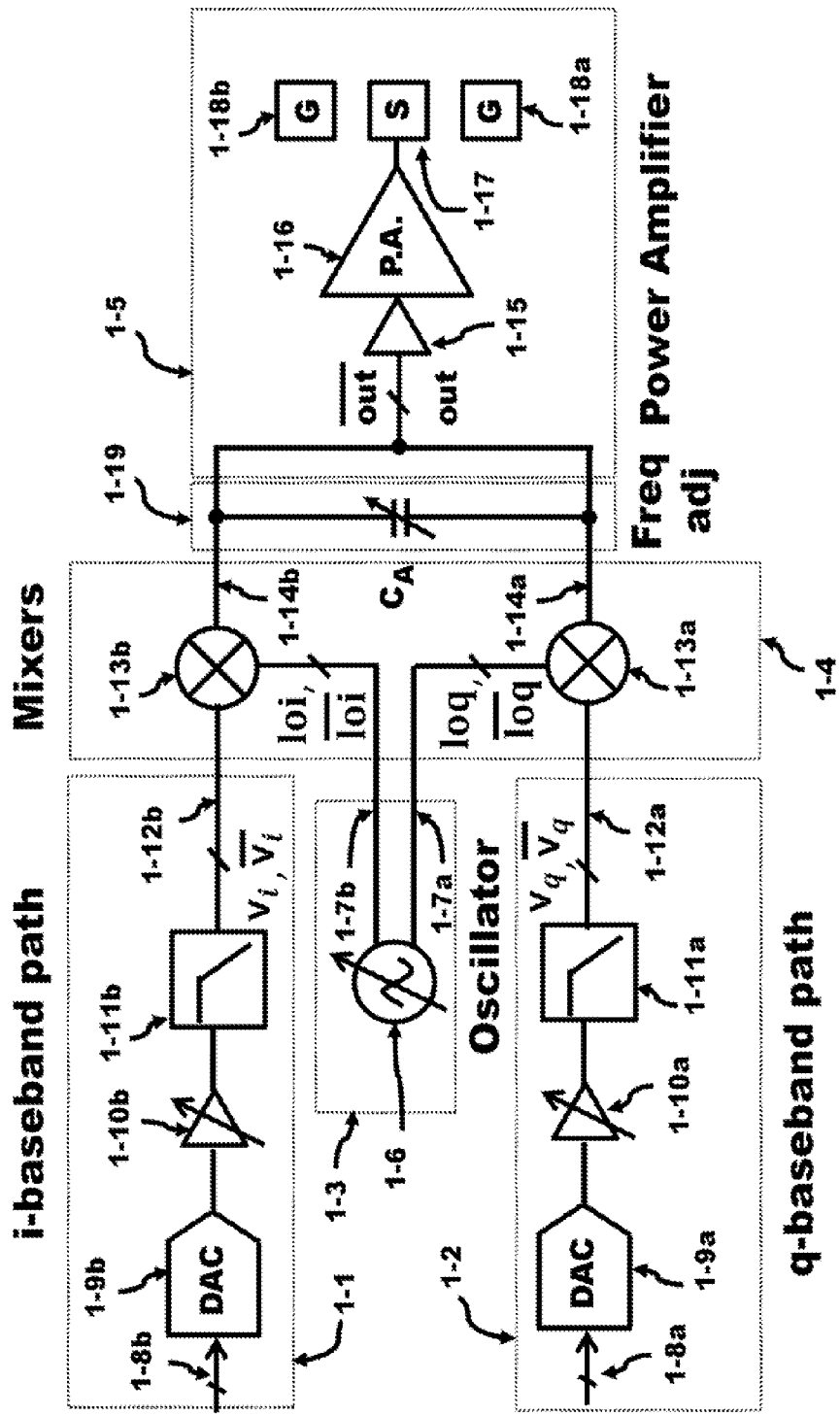
FIG. 1 depicts an I and Q up-converted transmit path.

FIG. 1 illustrates an up-conversion communication signal path. There are two baseband signal paths; the i-baseband path 1-1 and the q-baseband path 1-2. The quadrature and in-phase input signal to both of these baseband paths are applied at 1-8a and 1-8b, respectively, which are then applied to the digital to analog converter (DAC) 1-9a and 1-9b, respectively. Adjustable gain amplifiers 1-10a and 1-10b amplify and apply the output of the digital to analog converters to the low pass filters 1-11a and 1-11b. The output of the low pass filter 1-11a generates a quadrature voltage $V_q$ and an inverse quadrature voltage $\overline{V_q}$ as illustrated on the line 1-12a. The output of the low pass filter 1-11b generates the in-phase voltage $V_i$ and an inverse in-phase voltage $\overline{V_i}$ as illustrated on the line 1-12b.

An adjustable oscillator 1-6 generates a frequency at about 60 GHz and is illustrated in the dotted box 1-3. A differential in-phase oscillation signal loi and its inverse $\overline{loi}$ are generated on line 1-7b while a differential quadrature oscillation signal loq at its inverse $\overline{loq}$ are generated on lines 1-7a. The differential i-signal outputs 1-12b of the i-baseband path 1-1, the differential q-signal outputs 1-12a of the q-baseband path 1-2 and the oscillator 1-3 outputs 1-7a and 1-7b at a frequency of about 60 GHz are applied to the Gilbert mixer block 1-4. The output of the Gilbert mixer is coupled to a frequency adjust circuit 1-19 to adjust the frequency of the Gilbert mixer outputs out 1-14a and $\overline{out}$ 1-14b which is then coupled to the input of the power amplifier 1-5.

The differential i-signals 1-12b from the i-baseband path 1-1 and the differential in-phase oscillator signals and its inverse 1-7b are applied to the Gilbert mixer 1-13b. The differential i-signals of output 1-12b consist of $V_i$ and $\overline{V_i}$. The differential in-phase oscillator signals at a frequency about 60 GHz are called loi and $\overline{\text{loi}}$. The output of the Gilbert mixer 1-13b generates the signal $\overline{\text{out}}$ 1-14b and the signal out 1-14a. The differential q-signals 1-12a from the q-baseband path 1-2 and the differential quadrature oscillator signal output and its inverse 1-7a are applied to the Gilbert mixer 1-13a. The differential q-signals 1-12a consists of the quadrature voltage $V_q$ and an inverse quadrature voltage $\overline{V_q}$. The differential oscillator outputs 1-7a are called signal loq at its inverse $\overline{\text{loq}}$. The output of the Gilbert mixer 1-13a generates the signal out 1-14a and the signal $\overline{\text{out}}$ 1-14b. The current signals of out 1-14a and $\overline{\text{out}}$ 1-14b from both mixers 1-13b and 1-13a are added together to generate the output signal $\overline{\text{out}}$ 1-14b and the output signal out 1-14a.

The frequency adjust circuit 1-19 consists of an adjustable capacitor $C_A$. The adjustment of the capacitor occurs by applying a variable voltage to $C_A$ which changes the parameters of the capacitor presented to the output signals out 1-14a and $\overline{\text{out}}$ 1-14b of the Gilbert mixer 1-4. The variation of the capacitance value allows the frequency of the tank circuit coupled to the Gilbert mixer to be adjusted.

The differential output signals out 1-14a and $\overline{\text{out}}$ 1-14b are applied to the power amplifier 1-5. Inside the power amplifier 1-5, these two signals are presented to the pre-driver 1-15 which amplifies the signal as well as perform impedance matching before being coupled to the input of the final power amplifier 1-16. The output of the power amplifier 1-16 is coupled to a bonding pad 1-17 which can be wired or solder bumped to an antenna. In this particular case, a test structure of a pattern ground 1-18b, the bonding pad 1-17 and a ground 1-18a is illustrated. Although one skilled in the arts can couple the output of the power amplifier to an antenna using other bonding pad configurations.

Figure 2A:
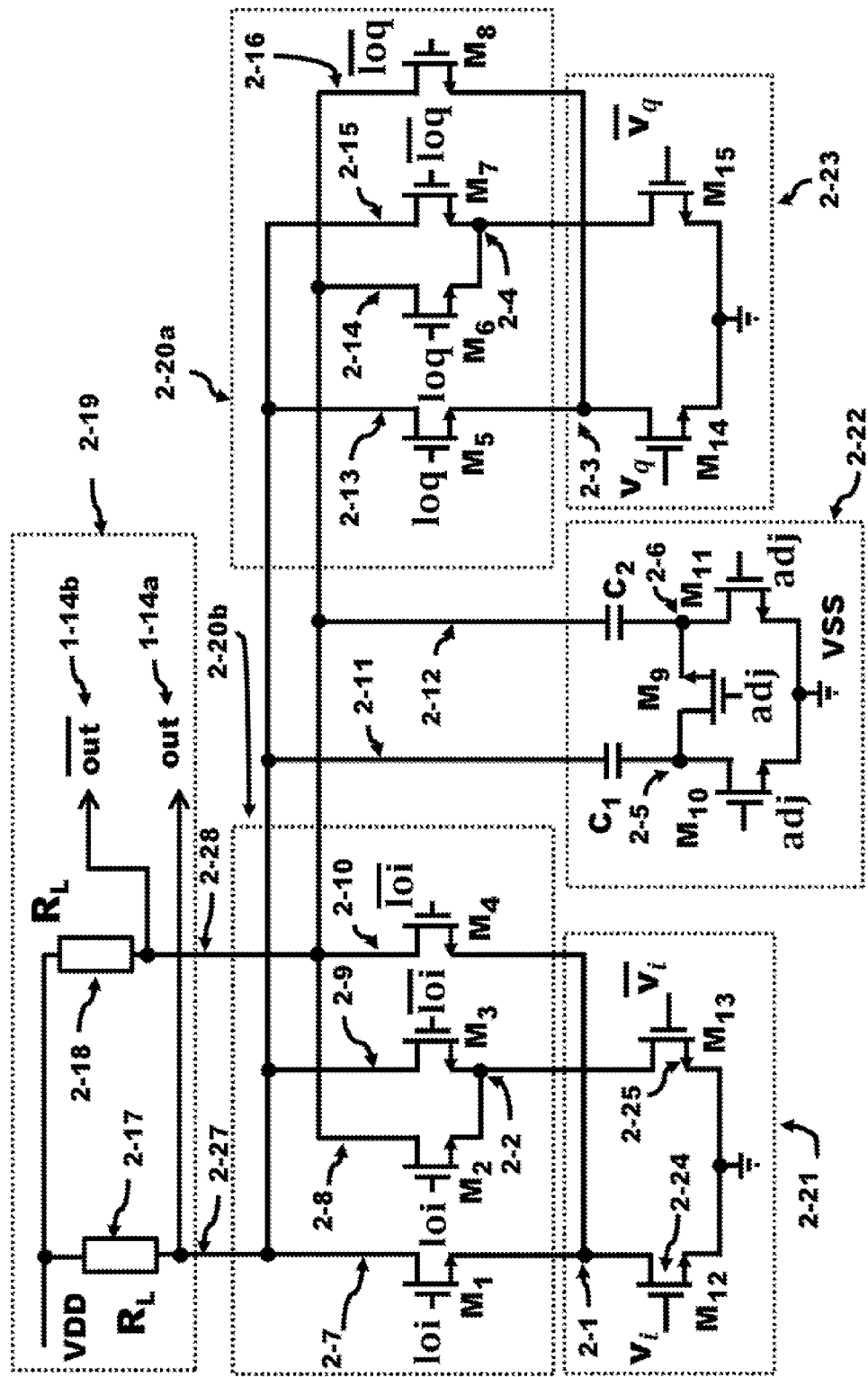
FIG. 2A shows an I and Q Gilbert mixer that combines the current results together.

FIG. 2A illustrates a more detailed view of the Gilbert mixer 1-4 and the frequency adjust circuit 1-19 presented in FIG. 1. The $V_i$ and $\overline{V_i}$ signals from the i-baseband path are applied to the differential voltage to current converter 2-21 consisting of the NMOS transistors $M_{12}$ 2-24 and $M_{13}$ 2-25. The drains of $M_{12}$ and $M_{13}$ are connected together to power supply VSS, one of the gates receives one of the baseband signal while the other receives the inverse. The drains are the two outputs of the differential voltage to current converter 2-21 are coupled to nodes 2-1 and 2-2.

The generated current flows through the nodes 2-1 and 2-2 into the switch 2-20b. The differential switch 2-20b comprises a plurality of transistors and each gate is driven by full rail to rail voltages output by one of the differential in-phase oscillator signals loi and $\overline{\text{loi}}$. Because of the full rail to rail voltages driving the gates of $M_1$-$M_4$, these NMOS transistors behave as switches. The sources of the plurality of transistor ($M_1$-$M_4$) are coupled to one of the two nodes 2-1 and 2-2. The drains of the plurality of transistor are coupled to one of the two nodes 2-27 and 2-28 which are coupled to the differential outputs out 1-14a and $\overline{\text{out}}$ 1-14b. The switched currents flow through the interconnects 2-7 to 2-10 that are coupled to the two nodes 2-27 and 2-28.

The quadrature voltage $V_q$ and the inverse voltage $\overline{V_q}$ signals from the q-baseband path are applied to the differential voltage to current converter 2-23 consisting of NMOS transistors $M_{14}$ and $M_{15}$. Note that the structure or connectivity of the differential voltage to current converter 2-23 is substantially equivalent to the differential voltage to current converter 2-21. The generated current flows through the nodes 2-3 and 2-4 into the differential switch 2-20a.

The differential switch 2-20a is driven by full rail to rail voltages output by the differential quadrature oscillator signals loq at its inverse $\overline{\text{loq}}$. Because of the full rail to rail voltages driving the gates of $M_5$-$M_8$, these MOS transistors behave as switches. The sources of the plurality of transistor ($M_5$-$M_8$) are coupled to one of the two nodes 2-3 and 2-4. The drains of the plurality of transistor are coupled to one of the two nodes 2-27 and 2-28 which are also the differential outputs out 1-14a and $\overline{\text{out}}$ 1-14b. The switched currents flow through the interconnects 2-13 to 2-16 that are coupled to the two nodes 2-27 and 2-28 and add to the switched currents flow through the interconnects 2-7 to 2-10. Note that the structure or connectivity of the differential switch 2-20a is substantially equivalent to the differential switch 2-20b.

The current generated according to the switching sequence being applied to the gates of $M_1$-$M_4$ in interconnects 2-7, 2-9, 2-13 and 2-15 flows into node 2-27. The current generated according to the switching sequence being applied to the gates of $M_5$-$M_8$ in interconnects 2-8, 2-10, 2-14 and 2-16 flows into node 2-28. The switched current in nodes 2-27 and 2-28 are applied to the differential current to voltage converter 2-19 to generate the voltages out 1-14a and $\overline{\text{out}}$ 1-14b.

The differential current to voltage converter 2-19 comprises loads that can be a combination of resistive, inductive or capacitive loads or any combination therein as one skilled in the arts realizes. The load can be a separate or a differential load. For example, the impedances $R_L$ 2-17 and $R_L$ 2-18 can be coupled to a tank circuit acting as a differential load that is loading the Gilbert mixer. This tank circuit has a resonant frequency that is matched to the frequency of the operation of the switched current output of the Gilbert mixer. The load is coupled to VDD at one end, while the other end is coupled to the nodes 2-27 and 2-28.

In the case of the load being a tank circuit, a differential capacitance adjustment circuit 2-22 comprising the nodes 2-11 and 2-12 which couples through the coupling capacitor $C_1$ and $C_2$ to a three transistor configuration. The three transistor configuration consists of $M_{10}$ and $M_{11}$ coupled between a first plate of $C_1$ and $C_2$ and ground while a third transistor $M_9$ coupling the first plates of capacitors $C_1$ and $C_2$ together. A variable voltage is applied to the gate (adj) to the N-channels in $M_9$, M $M_{10}$ and $M_{11}$, the value of the differential capacitance between the nodes 2-11 and 2-12 can be adjusted which in turn adjusts the resonant frequency of the tank circuit.

Note in FIG. 2A that a single Gilbert mixer (with load) is illustrated inside of the dotted boxes: voltage to the current converter 2-21 comprising the NMOS transistors $M_{12}$ 2-24 and $M_{13}$ 2-25, the differential switch 2-20b comprising the NMOS transistors $M_1$-$M_4$ and the load or differential current to voltage converter 2-19. A second Gilbert mixer (sharing the previous load) is illustrated inside of the dotted boxes: voltage to the current converter 2-23, the differential switch 2-20a and the load or differential current to voltage converter 2-19. Their outputs are coupled together at nodes 2-27 and 2-28.

Figure 2B:
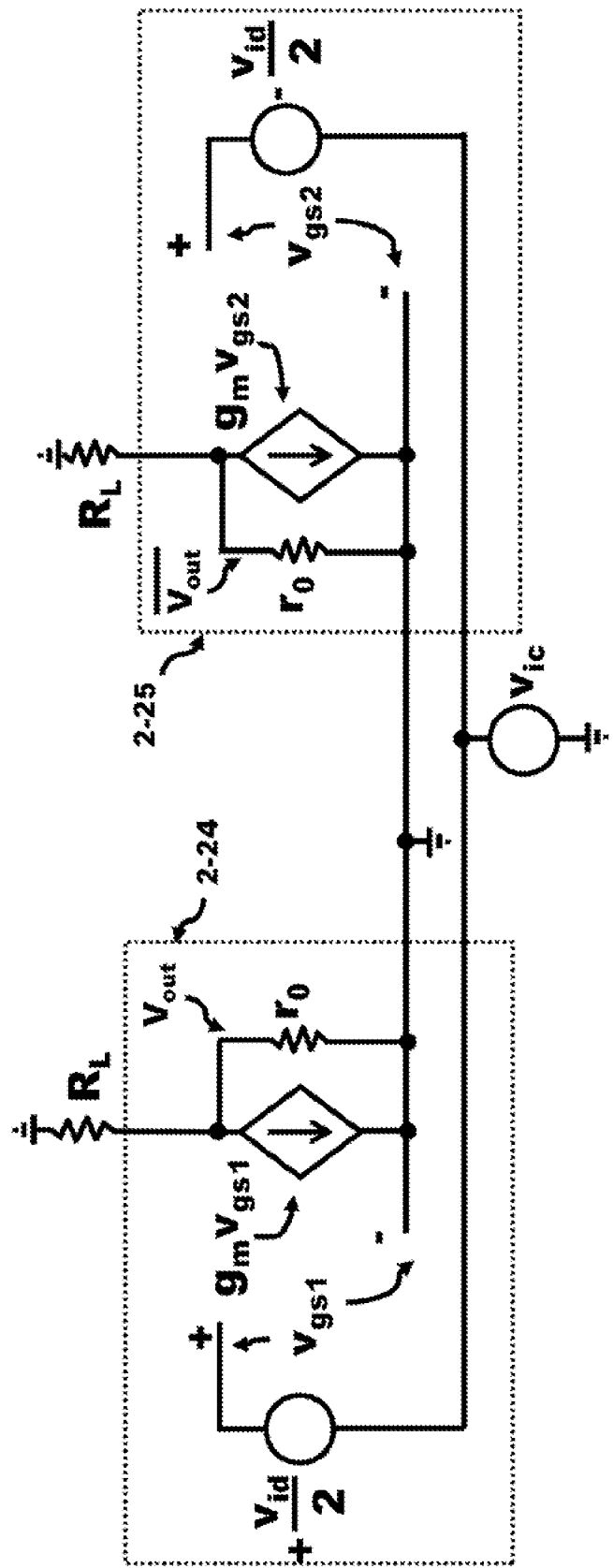
FIG. 2B presents a small signal model of one of the Gilbert mixers in FIG. 2A.

FIG. 2B illustrates the small signal model of the Gilbert mixer presented inside the dotted boxes 2-21, 2-20b and 2-19 of FIG. 2A. The model of the NMOS transistor $M_{12}$ 2-24 includes the gate to source voltage $V_{gs1}$, the $g_m$ voltage controlled current source $g_m V_{gs1}$ and the $R_0$ impedance across the current source. This model will be used when the inventive cross coupled negative $g_m$ transistor circuit is presented. The differential voltage to current converters $M_{12}$ and $M_{13}$ are illustrated within the dotted boxes 2-24 and 2-25, respectively. The switches in 2-20b are assumed ideal and therefore do not influence the circuit model illustrated in FIG. 2B and are replaced by a short. The differential current to voltage converters are the loads in 2-19 can be resistive, capacitive or inductive or any combination therein. A differential signal is applied to the voltage to current conversion 2-21 of the Gilbert mixer. In the small signal model, the input to the Gilbert mixer is segregated into a common voltage $V_{ic}$ which is coupled to the difference voltages each having an opposite polarity from one another. The difference voltages comprise and $-V_{id}/2$. The voltage $V_{id}/2$ is applied to the gate of transistor 2-24 while the voltage $-V_{id}/2$ is applied to the gate of transistor 2-25. Since the common voltage $V_{ic}$ is applied to both sides of the differential circuit, the comment mode voltage will cancel. However, the difference mixer differential voltage to current converter 2-21 amplifies the difference voltage of $V_{id}/2$ being applied to the gate of the transistor 2-24 of the small signal model against $-V_{id}/2$ being applied to the gate of the transistor 2-25 of the small signal model.

Figure 3A:
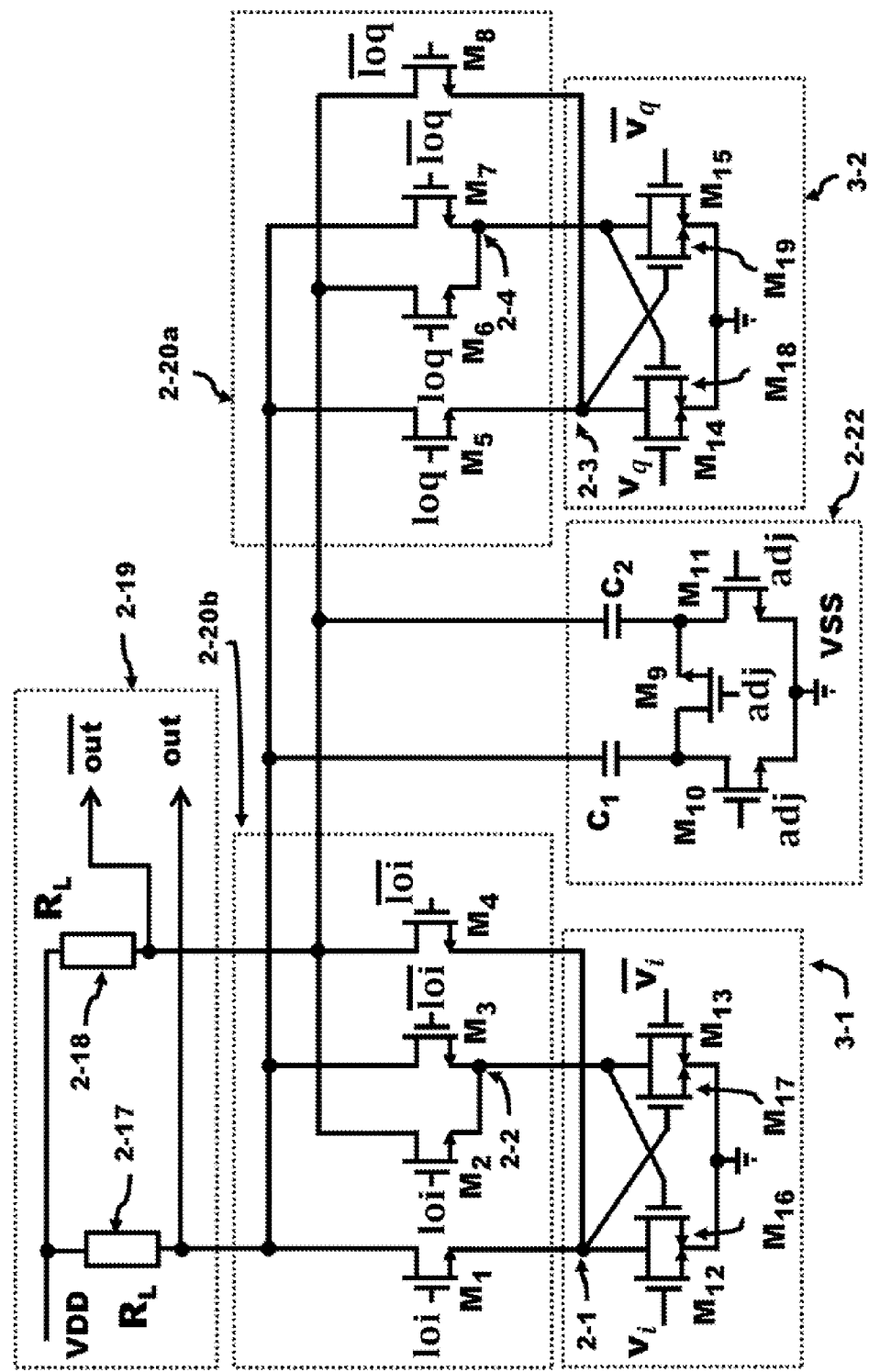
FIG. 3A illustrates the innovative NMOS negative $g_m$ differential cross coupled I and Q Gilbert mixer in accordance with the present invention.

FIG. 3A illustrates the Gilbert mixers with the inventive cross coupled NMOS transistors providing a negative $g_m$ transistor circuit to the differential voltage to current conversion portion of the mixer. All transistors in this circuit except for transistors $M_{16}$, $M_{17}$, $M_{18}$ and $M_{19}$ are identical to the previously presented Gilbert mixer illustrated in FIG. 2A. $M_{16}$, $M_{17}$, $M_{18}$ and $M_{19}$ are formed of the same conductivity MOS transistors. Typically, the dimensions of the transistors $M_{12}=M_{13}$ and $M_{16}=M_{17}$ to keep the controlled current sources in both paths of the differential voltage to current conversion circuit equivalent. In this particular case, they have the conductivity of NMOS transistors. The Gilbert mixer for the in-phase signals comprises the differential voltage to current converter 3-1 coupled to the differential switch 2-20b which is coupled to the load 2-19. The Gilbert mixer for the quadrature phase signals comprises the differential voltage to current converter 3-2 coupled to the differential switch 2-20a which is also coupled to the load 2-19. These components also form a single Gilbert mixer with the inventive cross coupled NMOS transistors providing a negative $g_m$ transistor circuit, although the complete circuit in FIG. 3A illustrates two Gilbert mixers coupled together. A capacitive adjust circuit 2-22 varies the capacitance loading the nodes out and $\overline{\text{out}}$.

The cross coupled transistors shown within the differential voltage to current converter 3-1 of the in-phase Gilbert mixer are $M_{16}$ and $M_{17}$. The source and drain of $M_{16}$ is connected to the source and drain of an $M_{12}$, respectively, while the source and drain of $M_{17}$ is connected to the source and drain of an $M_{13}$, respectively. The gate of $M_{16}$ is coupled to node 2-2 while the gate of $M_{17}$ is coupled to 2-1 generating the cross coupled structure of the transistors $M_{16}$ and $M_{17}$ to provide a negative $g_m$ to the voltage to current conversion portion 3-1 of the in-phase Gilbert mixer illustrated in FIG. 3A.

The second cross coupled circuit is illustrated within the differential voltage to current converter 3-2 of the quadrature Gilbert mixer as $M_{18}$ and $M_{19}$. The source and drain of $M_{18}$ is connected to the source and drain of an $M_{14}$, respectively, while the source and drain of $M_{19}$ is connected to the source and drain of an $M_{15}$, respectively. Typically, the dimensions of the transistors $M_{14}=M_{15}$ and $M_{18}=M_{19}$. The gate of $M_{18}$ is coupled to node 2-4 while the gate of $M_{19}$ is coupled to 2-3 generating the cross coupled structure of the transistors $M_{18}$ and $M_{19}$ to provide a negative $g_m$ to the voltage to current conversion portion 3-2 of the quadrature Gilbert mixer illustrated in FIG. 3A.

The small signal model of the Gilbert mixer comprising with the inventive cross coupled NMOS transistors providing a negative $g_m$ transistor circuit of the voltage to current conversion portion 3-1, the differential switch 2-20b and the load 2-19 is presented in FIG. 3B. A comparison with FIG. 2B depicts two new blocks representing the transistors $M_{16}$ and $M_{17}$. The first cross coupled transistor $M_{16}$ introduces the current sources $g_m$ $\overline{\text{out}}$ and a corresponding $R_0$. The second cross coupled transistor $M_{17}$ introduces the current sources $g_m$ out and a corresponding $R_0$. These new elements are added to the small signal model that was presented in FIG. 2B. By simple manipulation and simplification, the equivalent circuit is presented in FIG. 3C which indicates the differential nature of the voltage to current conversion portion of the Gilbert mixer as well as providing the value of the two equivalent current sources. The voltage controlled current source for the combined transistors $M_{12}$ and $M_{16}$ is:

$$[(V_{id}/2)][g_{m1}/(1-g_{m2}R_L)]\qquad\text{EQU. 1}$$

while the voltage controlled current source for the combined transistors $M_{13}$ and $M_{17}$ is:

$$-[(V_{id}/2)][g_{m1}/(1-g_{m2}R_L)]\qquad\text{EQU. 2}$$

If $g_{m2}R_L=0.75$ in EQU. 1, $[g_{m1}/(1-g_{m2}R_L)]=[g_m/(1-0.25)]$ $4g_{m1}$ then the gain is increased 4 times. If $g_{m2}R_L=1.0$ in EQU. 1, $[g_{m1}/(1-g_{m2}R_L)]=[g_{m1}/0]\infty$ then the positive feedback causes the gain to be latched up.

Figure 4:
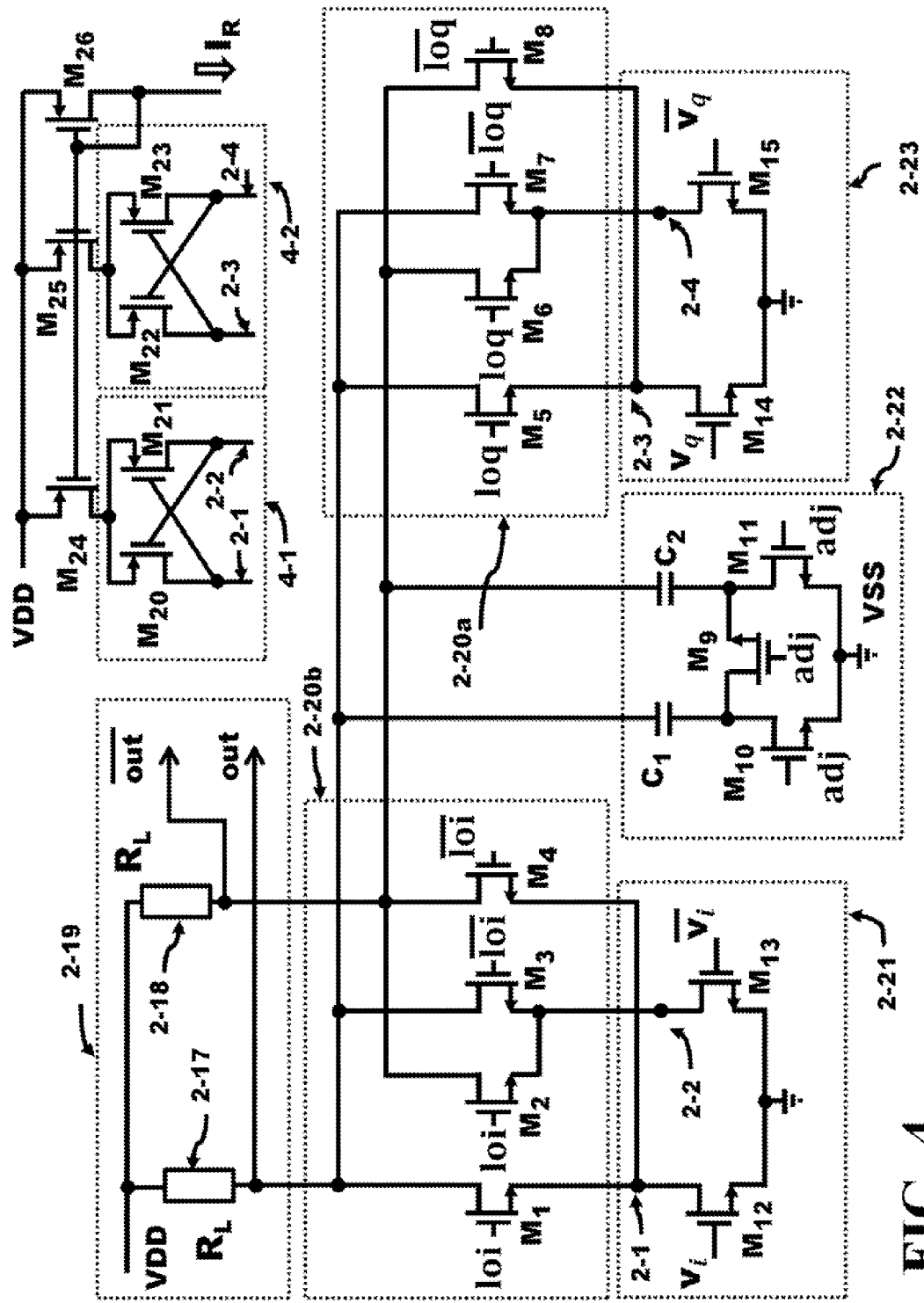
FIG. 4 illustrates the innovative PMOS negative $g_m$ differential cross coupled I and Q Gilbert mixer in accordance with the present invention.

FIG. 4A illustrates the Gilbert mixers with the inventive cross coupled PMOS transistors providing a negative $g_m$ transistor circuit applied to the differential voltage to current conversion portion of the mixer. All transistors are in this circuit of conductivity NMOS, except for transistors $M_{20}$, $M_{21}$, $M_{22}$ and $M_{23}$ which are of conductivity PMOS, are identical to the previously presented Gilbert mixer illustrated in FIG. 2A. The connectivity of the cross coupled PMOS transistors are illustrate as $M_{20}$ cross coupled to $M_{21}$ and $M_{22}$ cross coupled to $M_{23}$. These transistors have the same conductivity PMOS transistors. The outputs 2-1 and 2-2 of P-channel cross coupled circuit 4-1 are coupled to the nodes 2-1 and 2-2 of the voltage to the current converter 2-21. The outputs 2-3 and 2-4 of P-channel cross coupled circuit 4-2 are coupled to the nodes 2-3 and 2-4 of the voltage to the current converter 2-23. The cross coupled P-channel transistors are sourced by current source $M_{26}$ with a reference current $I_R$ while the current is mirrored by $M_{25}$ and $M_{24}$. These current source and mirror can be eliminated if required and the sources of $M_{20}$, $M_{21}$, $M_{22}$ and $M_{23}$ can be connected to VDD. The Gilbert mixer for the in-phase signals comprises the differential voltage to current converter 2-21 coupled to the differential switch 2-20b which is coupled to the load 2-19. The Gilbert mixer for the quadrature phase signals comprises the differential voltage to current converter 2-23 coupled to the differential switch 2-20a which is also coupled to the load 2-19. These components also form a single Gilbert mixer with the inventive cross coupled PMOS transistors providing a negative $g_m$ transistor circuit, although the complete circuit in FIG. 4A illustrates two Gilbert mixers coupled together. A capacitive adjust circuit 2-22 varies the capacitance loading the nodes out and $\overline{\text{out}}$.

Finally, it is understood that the above descriptions are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. For example, P-channels can be interchanged with N-channels, VDD interchanges with VSS, voltages measured with respect to the other power supply, the position of current sources moved to the other power supply, etc. The semiconductor die can include silicon, germanium, SI graphite, GaAs, SIO, etc. Although the circuits were described using CMOS, the same circuit techniques can be applied to depletion mode transistors and BJT or bipolar circuits, since this technology allows the formation of current sources and source followers. When a transistor is specified, the transistor can be a transistor such as an N-MOS or P-MOS. The CMOS or SOI (Silicon on Insulator) technology provides two enhancement mode channel types: N-MOS (N-channel) and P-MOS (P-channel) transistors or transistors. In addition, a network and a portable system can exchange information wirelessly by using communication techniques such as Time Division Multiple Access (TDMA), Frequency Division Multiple Access (FDMA), Code Division Multiple Access (CDMA), Orthogonal Frequency Division Multiplexing (OFDM), Ultra Wide Band (UWB), Wi-Fi, WiGig, Bluetooth, etc. The network can comprise the phone network, IP (Internet protocol) network, Local Area Network (LAN), ad hoc networks, local routers and even other portable systems.

What is claimed is:

1. A Gilbert mixer apparatus comprising:
   a first differential switch that couples a first differential voltage to current converter to a differential current to voltage converter; and
   the first differential voltage to current converter comprising:
   a cross coupled same conductivity MOS transistor circuit containing;
   a first and a second MOS device coupled between a first and a second node;
   a third and a fourth MOS device coupled between a third and the first node;
   a gate of the second MOS device connected to the third node; and
   a gate of the fourth MOS device connected to the second node.

2. The apparatus of claim 1, further comprising:
   a differential capacitance adjustment circuit coupled to the first differential current to voltage converter where a differential capacitance can be adjusted by a variable voltage.

3. The apparatus of claim 2, further comprising:
   a second differential voltage to current converter.

4. The apparatus of claim 3, further comprising:
   a second differential switch that couples the second differential voltage to current converter to the differential current to voltage converter.

5. The apparatus of claim 1, wherein
   the cross coupled same conductivity MOS transistor circuit increases a gain of the first differential voltage to current converter.

6. The apparatus of claim 1, wherein
   the differential current to voltage converter is a differential load.

7. The apparatus of claim 6, wherein
   the differential load can be formed from a resistive, an inductive or a capacitive loads or any combination therein.

8. The apparatus of claim 4, further comprising:
   a differential i-signal coupled to the first differential voltage to current converter;
   a differential q-signal coupled to the second differential voltage to current converter;
   a differential in-phase oscillation signal coupled to the first differential switch;
   a differential quadrature phase oscillation signal coupled to the second differential switch; and
   the first and second differential switch are coupled to the differential current to voltage converter, whereby
   the differential i-signal and the differential q-signal are converted to a frequency of an oscillation signal.

9. A Gilbert mixer apparatus comprising:
   a first differential voltage to current converter;
   a first differential current to voltage converter;
   a first differential switch that couples the first differential voltage to current converter to the first differential current to voltage converter; and
   the first differential voltage to current converter further comprises:
   a cross coupled same conductivity MOS transistor circuit containing;
   a first and a second MOS device coupled between a first and a second node;
   a third and a fourth MOS device coupled between a third and the first node;
   a gate of the second MOS device connected to the third node; and
   a gate of the fourth MOS device connected to the second node.

10. The apparatus of claim 9, further comprising:
    a differential capacitance adjustment circuit coupled to the first differential current to voltage converter where a differential capacitance can be adjusted by a variable voltage.

11. The apparatus of claim 10, further comprising:
    a second differential voltage to current converter.

12. The apparatus of claim 11, further comprising:
    a second differential switch that couples the second differential voltage to current converter to the first differential current to voltage converter.

13. The apparatus of claim 9, wherein
    the cross coupled same conductivity MOS transistor circuit increases a gain of the first differential voltage to current converter.

14. The apparatus of claim 9, wherein
    the first differential current to voltage converter is a differential load.

15. The apparatus of claim 14, wherein
    the differential load can be formed from a resistive, an inductive or a capacitive loads or any combination therein.

16. A method of up-converting a differential in-phase and a differential quadrature signal to a frequency of an oscillator signal comprising the steps of:
    providing a differential in-phase baseband signal to a first differential voltage to current converter with a first cross coupled same conductivity MOS transistor circuit;
    providing a differential quadrature baseband signal to a second differential voltage to current converter with a second cross coupled same conductivity MOS transistor circuit;
    coupling the first differential voltage to current converter to a differential current to voltage converter using a first differential switch;
    coupling the second differential voltage to current converter to the differential current to voltage converter using a second differential switch;
    providing a differential in-phase oscillator signal to the first differential switch; and
    providing a differential quadrature oscillator signal to the second differential switch, thereby up-converting a differential in-phase and a differential quadrature signal to the frequency of the oscillator signal, wherein
the cross coupled same conductivity MOS transistor circuit increases a gain of each differential voltage to current converter.

17. The method of claim 16, further comprising the steps of:
adjusting the frequency of the up-converted differential signal with a differential capacitance adjustment circuit.

18. The method of claim 17, further comprising the steps of:
applying an adjustment voltage to the differential capacitance adjustment circuit to vary a capacitance.

19. The method of claim 16, whereby
the first cross coupled same conductivity MOS transistor circuit reduces a saturation voltage of the first differential voltage to current converter, and
the second cross coupled same conductivity MOS transistor circuit reduces a saturation voltage of the second differential voltage to current converter.

20. The method of claim 19, further comprising the steps of:
coupling the up-converted differential signal to a power amplifier stage; and
coupling the power amplifier stage to a bonding pad.

* * * * *

UNITED STATES PATENT AND TRADEMARK OFFICE
CERTIFICATE OF CORRECTION

PATENT NO.         : 8,836,407 B1                                             Page 1 of 1
APPLICATION NO.    : 13/789681
DATED              : September 16, 2014
INVENTOR(S)        : Zaw Soe et al.

It is certified that error appears in the above-identified patent and that said Letters Patent is hereby corrected as shown below:

On the Title Page
Item (72) in the Inventor Names, second name, the name "Tham KhongMeng" should read
-- KhongMeng Tham --:
Item (57) in the Abstract, first sentence, the word "A cross" should read -- Cross --:
Item (57) in the Abstract, the word "at" should read -- as --:

In the Specification
In column 1, line 58, the words "to place the" should read -- to --:
In column 2, line 11, the word "against" should read -- for --:
In column 2, line 16, the words "system to" should read -- system --:
In column 4, line 33, the word "up-converters" should read -- up-converts --:
In column 5, line 25, the word "perform" should read -- performs --:
In column 6, line 39, the word "M M" should read -- M --:
In column 6, line 57, the word "$R_0$" should read -- $r_0$ --:
In column 7, line 60, the words "with the" should read -- the --:
In column 7, line 66, the word "$g_m$" should read -- $g_{m2}$ --:
In column 7, line 66, the word "$R_0$" should read -- $r_0$ --:
In column 8, line 1, the word "$g_m$ *out*" should read -- $g_{m2}$ *out* --:
In column 8, line 1, the word "$R_0$" should read -- $r_0$ --:
In column 8, line 17, the word "$[g_{m1}/0]\infty$" should read -- $[g_{m1}/0] = \infty$ --:
In column 8, line 19, the word "4A" should read -- 4 --:
In column 8, line 27, the word "illustrate" should read -- illustrated --:
In column 8, line 48, the word "4A" should read -- 4 --.

Signed and Sealed this
Twelfth Day of May, 2015

Michelle K. Lee
*Director of the United States Patent and Trademark Office*